(12) United States Patent
Matsuda et al.

(10) Patent No.: US 8,659,692 B2
(45) Date of Patent: Feb. 25, 2014

(54) SOLID-STATE IMAGE SENSOR AND IMAGE SENSING APPARATUS (75) Inventors: Takashi Matsuda, Yokohama (JP); Yuichiro Yamashita, Ebina (JP); Shoji Kono, Hachioji (JP)

(73) Assignee: Canon Kabushiki Kaisha, Tokyo (JP)

( * ) Notice: Subject to any disclaimer, the term of this patent is extended or adjusted under 35 U.S.C. 154(b) by 75 days.

(21) Appl. No.: 12/881,373

(22) Filed: Sep. 14, 2010

(65) Prior Publication Data
US 2011/0080492 A1 Apr. 7, 2011

(30) Foreign Application Priority Data

Oct. 6, 2009 (JP) ................................. 2009-232867

(51) Int. Cl.
*H04N 3/14* (2006.01)

(52) U.S. Cl.
USPC ............................. 348/302; 348/281; 348/300

(58) Field of Classification Search
USPC ............................................. 348/294, 230.1
See application file for complete search history.

(56) References Cited

U.S. PATENT DOCUMENTS

| | | | | |
|---|---|---|---|---|
| 5,512,945 A * | 4/1996 | Sakurai et al. | ............ | 348/221.1 |
| 5,831,258 A * | 11/1998 | Street | ............ | 250/208.1 |
| 6,275,261 B1 * | 8/2001 | Yamazaki | ............ | 348/273 |
| 6,930,299 B2 * | 8/2005 | Ohkawa | ............ | 250/208.1 |
| 7,623,056 B2 | 11/2009 | Yamashita | ............ | 341/163 |
| 7,633,539 B2 | 12/2009 | Yamashita | ............ | 348/294 |
| 7,817,199 B2 | 10/2010 | Yamashita et al. | ............ | 348/308 |
| 7,986,353 B2 * | 7/2011 | Ono | ............ | 348/241 |
| 2005/0035927 A1 * | 2/2005 | Kimura | ............ | 345/55 |
| 2005/0237408 A1 | 10/2005 | Muramatsu | ............ | 348/308 |
| 2007/0159542 A1 * | 7/2007 | Luo | ............ | 348/272 |
| 2008/0030612 A1 * | 2/2008 | Itano et al. | ............ | 348/340 |
| 2008/0088724 A1 | 4/2008 | Kudoh | ............ | 348/300 |
| 2009/0073294 A1 * | 3/2009 | Morimoto | ............ | 348/300 |
| 2009/0219422 A1 * | 9/2009 | Takeuchi et al. | ............ | 348/300 |
| 2009/0244328 A1 | 10/2009 | Yamashita | ............ | 348/241 |
| 2009/0256176 A1 | 10/2009 | Kobayashi et al. | ............ | 257/225 |
| 2009/0284632 A1 | 11/2009 | Onuki et al. | ............ | 348/302 |
| 2009/0310001 A1 * | 12/2009 | Masuyama et al. | ............ | 348/300 |
| 2009/0322917 A1 * | 12/2009 | Kyogoku et al. | ............ | 348/273 |
| 2010/0053398 A1 | 3/2010 | Yamashita | ............ | 348/302 |
| 2010/0165167 A1 | 7/2010 | Sugiyama et al. | ............ | 348/311 |
| 2010/0200738 A1 | 8/2010 | Yamashita | ............ | 250/227.11 |
| 2013/0250137 A1 * | 9/2013 | Matsuda et al. | ............ | 348/222.1 |

FOREIGN PATENT DOCUMENTS

| | | |
|---|---|---|
| EP | 1 628 468 A2 | 2/2006 |
| EP | 2 315 435 A1 | 4/2011 |
| JP | 2005-311821 A | 11/2005 |
| JP | 2006-74367 A | 3/2006 |

* cited by examiner

*Primary Examiner* — James Hannett
*Assistant Examiner* — Wesley J Chiu
(74) *Attorney, Agent, or Firm* — Fitzpatrick, Cella, Harper & Scinto

(57) ABSTRACT

In an image sensor including a first column readout line and a second column readout line provided to each pixel column, a plurality of pixel rows are divided into pixel rows of a first group and pixel rows of a second group, pixels of the pixel rows of the first group output signals to the first column readout line, and pixels of the pixel rows of the second group output signals to the second column readout line. A shortest distance between a conversion region of a first pixel of a pixel row of the first group and the first column readout line to which a signal from the first pixel is output is not more than a shortest distance between the conversion region of the first pixel and the second column readout line to which the signals from the pixels belonging to the pixel rows of the second group are output.

11 Claims, 7 Drawing Sheets

SOLID-STATE IMAGE SENSOR AND IMAGE SENSING APPARATUS

BACKGROUND OF THE INVENTION

1. Field of the Invention

The present invention relates to a solid-state image sensor, and an image sensing apparatus including the same.

2. Description of the Related Art

In recent years, as digital still cameras and digital video cameras are downsized and improved in resolution, the number of pixels built into solid-state image sensor has increased. With this increase in the number of pixels, the number of signals read from the solid-state image sensor per unit time has also increased. Further, strong demand has arisen for high-speed continuous shooting in which a plurality of object images are shot continuously. Hence, it is necessary to raise the rate of signal read from solid-state image sensors.

Japanese Patent Laid-Open No. 2005-311821 discloses a high-rate read technique for a solid-state image sensor. More specifically, Japanese Patent Laid-Open No. 2005-311821 discloses a solid-state image sensor which includes a plurality of column readout lines provided to each column in a pixel array, and can simultaneously read signals in a plurality of rows of the pixel array by simultaneously activating those rows. Japanese Patent Laid-Open No. 2005-311821 merely discloses a mechanism in which each column in a pixel array includes a plurality of column readout lines, and does not disclose any layout diagram that shows the structure of pixels.

SUMMARY OF THE INVENTION

The present invention provides a layout advantageous in an arrangement in which a plurality of column readout lines are arranged in each pixel column which forms a pixel array.

One of aspects of the present invention provides a solid-state image sensor which includes a pixel array in which a plurality of pixels are two-dimensionally arranged so as to form a plurality of pixel rows and a plurality of pixel columns, and a first column readout line and a second column readout line provided to each pixel column, wherein the plurality of pixel rows which form the pixel array are divided into pixel rows of a first group and pixel rows of a second group, each pixel includes a photoelectric conversion element, a conversion region which converts a charge generated in the photoelectric conversion element into a voltage, a transfer element which transfers the charge generated in the photoelectric conversion element to the conversion region, and an amplification element which outputs a signal in accordance with the voltage converted in the conversion region, pixels belonging to the pixel rows of the first group output signals to the first column readout line, and pixels belonging to the pixel rows of the second group output signals to the second column readout line, a shortest distance between the conversion region of a first pixel belonging to a pixel row of the first group and the first column readout line to which a signal from the first pixel is output is not more than a shortest distance between the conversion region of the first pixel and the second column readout line to which the signals from the pixels belonging to the pixel rows of the second group are output, and a shortest distance between the conversion region of a second pixel belonging to a pixel row of the second group and the second column readout line to which a signal from the second pixel is output is not more than a shortest distance between the conversion region of the second pixel and the first column readout line to which the signals from the pixels belonging to the pixel rows of the first group are output.

Further features of the present invention will become apparent from the following description of exemplary embodiments with reference to the attached drawings.

DESCRIPTION OF THE EMBODIMENTS

Embodiments of the present invention will be described below with reference to the accompanying drawings.

Figure 6:
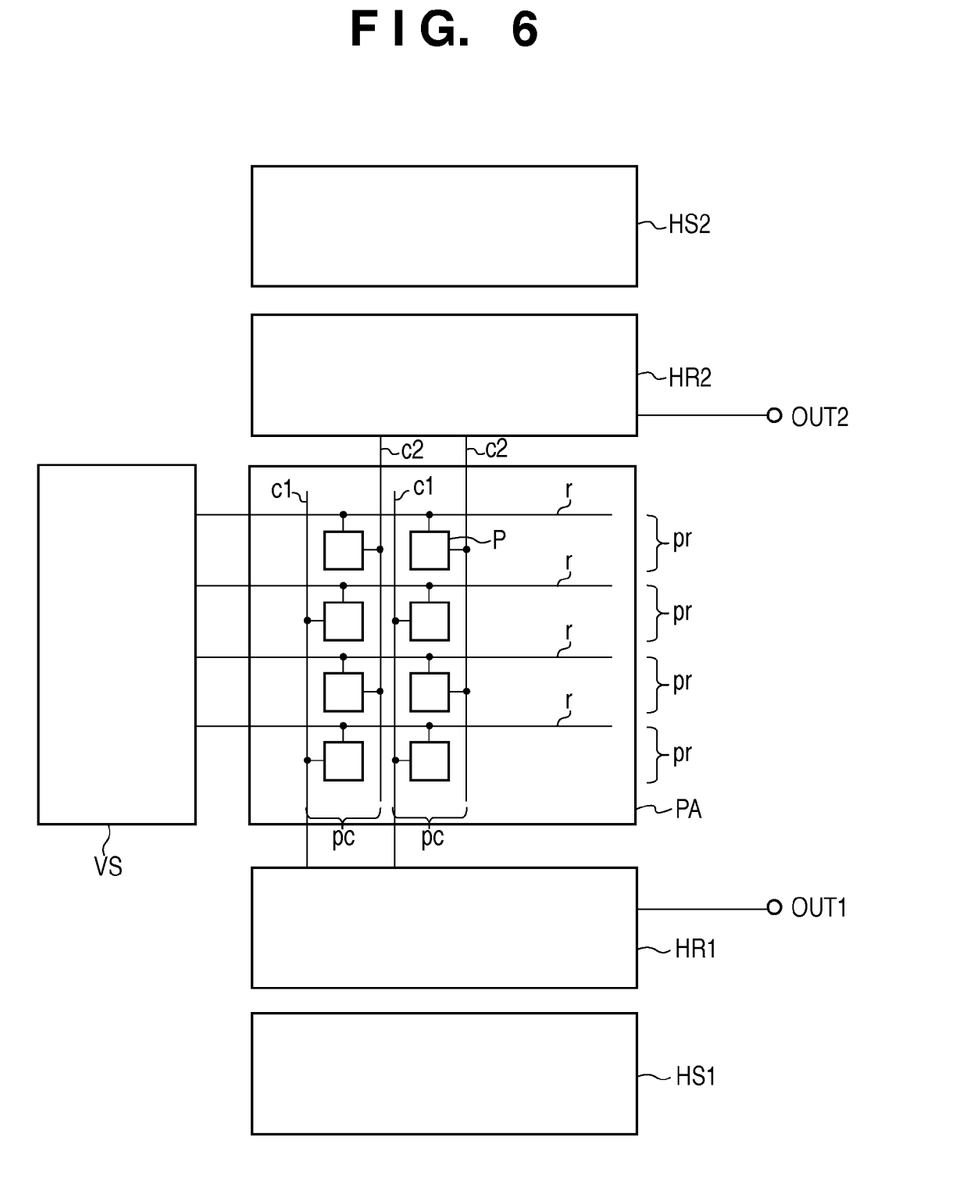
FIG. 6 is a block diagram showing the schematic arrangement of a solid-state image sensor according to an embodiment of the present invention.

FIG. 6 is a block diagram showing the schematic arrangement of a solid-state image sensor IS according to an embodiment of the present invention. The solid-state image sensor IS is designed as an active pixel image sensor such as a CMOS image sensor. An active pixel image sensor is a solid-state image sensor in which each pixel includes a photoelectric conversion element and an amplification element which amplifies a signal obtained by photoelectric conversion by the photoelectric conversion element. The solid-state image sensor IS includes a pixel array PA, vertical selection circuit VS, first readout circuit HR1, second readout circuit HR2, first horizontal selection circuit HS1, and second horizontal selection circuit HS2. The pixel array PA includes a plurality of pixels p which are two-dimensionally arranged so as to form a plurality of pixel rows pr and a plurality of pixel columns pc. Each pixel p is designed as an active pixel, and includes a photoelectric conversion element and an amplification element which amplifies a signal obtained by photoelectric conversion by the photoelectric conversion element. FIG. 6 illustrates a pixel array simplified for the sake of descriptive convenience as the pixel array PA. Each pixel column pc in the pixel array PA includes two column readout lines: a first column readout line c1 and a second column readout line c2.

The plurality of pixel rows pr which form the pixel array PA are divided into pixel rows of a first group and those of a second group. For example, the first group can include odd rows (odd-numbered rows), and the second group can include even rows (even-numbered rows). Alternatively, the first group can include even rows, and the second group can include odd rows. The first column readout lines c1 can be used to read signals from pixels in even rows, and the second column readout lines c2 can be used to read signals from pixels in odd rows. Alternatively, the first column readout lines c1 may be used to read signals from pixels in odd rows, and the second column readout lines c2 may be used to read signals from pixels in even rows. Or again, an arbitrary half of the plurality of pixel rows pr which form the pixel array PA can be classified as a first group, and the remaining half can be classified as a second group.

The vertical selection circuit VS simultaneously selects one pixel row belonging to the first group in the pixel array PA, and one pixel row belonging to the second group in the pixel array PA. The first readout circuit HR1 reads a signal via the first column readout line c1 from a pixel belonging to one of two simultaneously selected pixel rows pr in the pixel array PA, and outputs it to a first output terminal OUT1. The second readout circuit HR2 reads a signal via the second column readout line c2 from a pixel belonging to the other one of the two simultaneously selected pixel rows pr in the pixel array PA, and outputs it to a second output terminal OUT2. The first readout circuit HR1 and second readout circuit HR2 are preferably arranged to sandwich the pixel array PA between them. The first horizontal selection circuit HS1 selects a pixel column pc to be read in the pixel array PA. The second horizontal selection circuit HS2 also selects a pixel column pc to be read in the pixel array PA.

Figure 1:
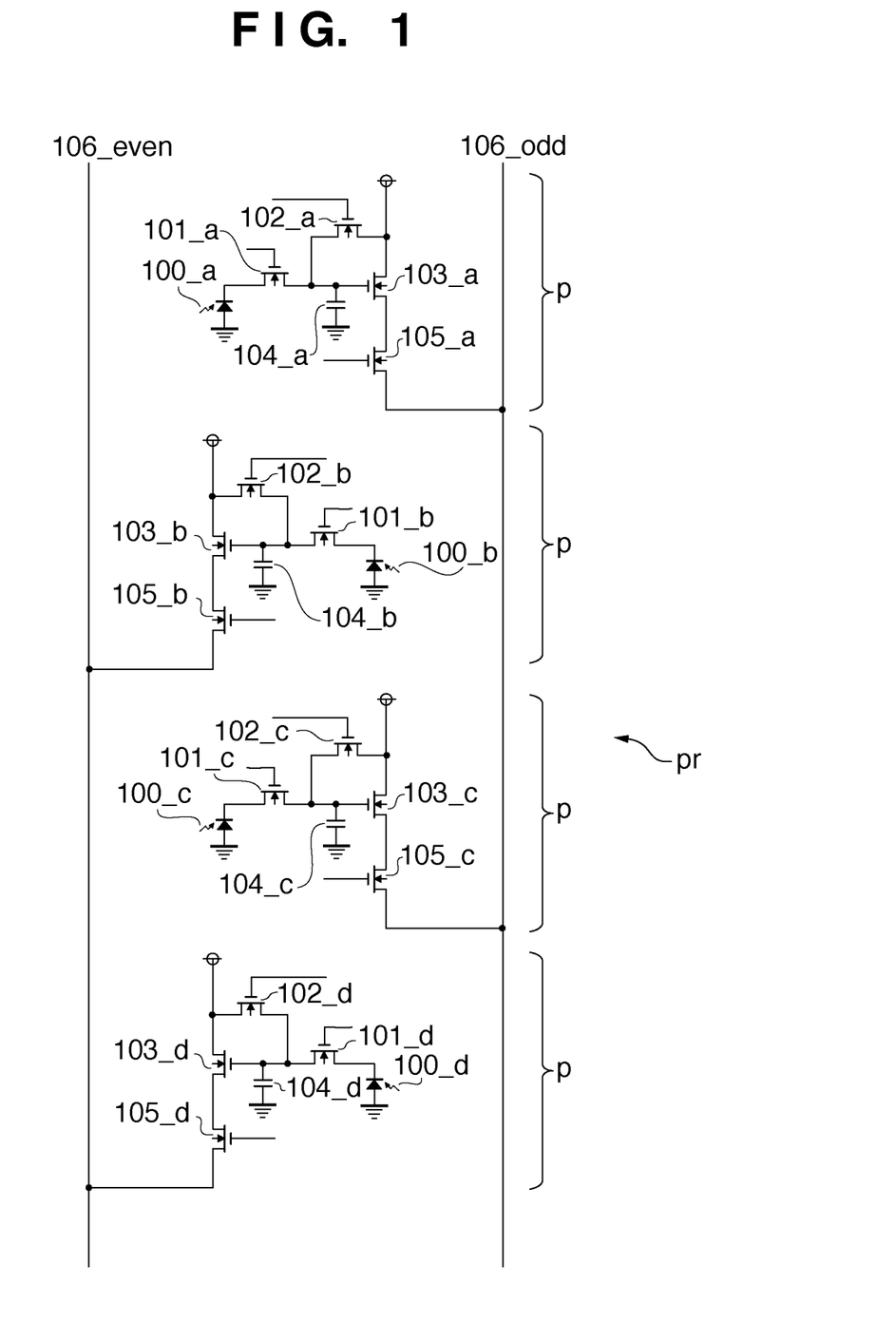
FIG. 1 is a circuit diagram exemplifying the partial circuitry of one pixel column in a pixel array.

FIG. 1 is a circuit diagram exemplifying the partial circuitry of one pixel column pc in the pixel array PA in the first embodiment of the present invention. Although one pixel column pc includes four pixels p in the example shown in FIG. 1, this arrangement is illustrated by simplifying an actual arrangement for the sake of descriptive convenience. Hence, in practice, one pixel column pc can include a larger number of pixels. In the following description, the first column readout lines c1 are assumed as column readout lines 106_even used to read signals from pixels in even rows, and the second column readout lines c2 are assumed as column readout lines 106_odd used to read signals from pixels in odd rows. However, the first column readout lines c1 may be column readout lines 106_odd used to read signals from pixels in odd rows, and the second column readout lines c2 may be column readout lines 106_even used to read signals from pixels in even rows.

In the example shown in FIG. 1, each pixel p includes a photodiode 100, a floating diffusion (to be abbreviated as an FD hereinafter) 104, an amplification transistor 103, a reset transistor 102, a row selection transistor 105, and a transfer transistor 101. However, the arrangement of each pixel p is not limited to the example shown in FIG. 1, and the row selection transistor 105 is unnecessary in, for example, an arrangement which selects a row by controlling the voltage of the FD.

The photodiode 100 (photodiodes 100_a, 100_b, ...) exemplifies a photoelectric conversion element. The FD 104 (FDs 104_a, 104_b, ...) exemplifies a conversion region (capacitance element) which holds a charge output from the photodiode 100 and converts it into a voltage. The amplification transistor 103 (amplification transistors 103_a, 103_b, ...) exemplifies an amplification element which amplifies the signal transferred to the FD 104. The reset transistor 102 (reset transistors 102_a, 102_b, ...) exemplifies a reset element which resets (initializes) the voltage of the FD 104, and can be controlled by the vertical selection circuit VS. The row selection transistor 105 (row selection transistors 105_a, 105_b, ...) exemplifies a switch for selecting a row, and can be controlled by the vertical selection circuit VS. The transfer transistor 101 (transfer transistors 101_a, 101_b, ...) exemplifies a transfer element for transferring a charge generated by photoelectric conversion in the photodiode 100 to the FD 104, and can be controlled by the vertical selection circuit VS. Note that the reset transistors 102 in all pixels belonging to one row pr can be controlled by means of a common reset signal driven by the vertical selection circuit VS. Also, the row selection transistors 105 in all pixels belonging to one row pr can be controlled by means of a common row selection signal driven by the vertical selection circuit VS. The transfer transistors 101 in all pixels belonging to one row Pr can be controlled by means of a common transfer signal driven by the vertical selection circuit VS. The vertical selection circuit VS typically simultaneously selects a pair of the first pixel row on the second pixel row, and then simultaneously selects a pair of the third pixel row on the fourth pixel row; it simultaneously selects a pair of two adjacent pixel rows. Note that when pixel rows have been selected, signals are output from pixels in the pixel rows to the column readout lines. A set of the above-mentioned reset signal, row selection signal, and transfer signal are shown as a control signal r in FIG. 6.

Figure 2:
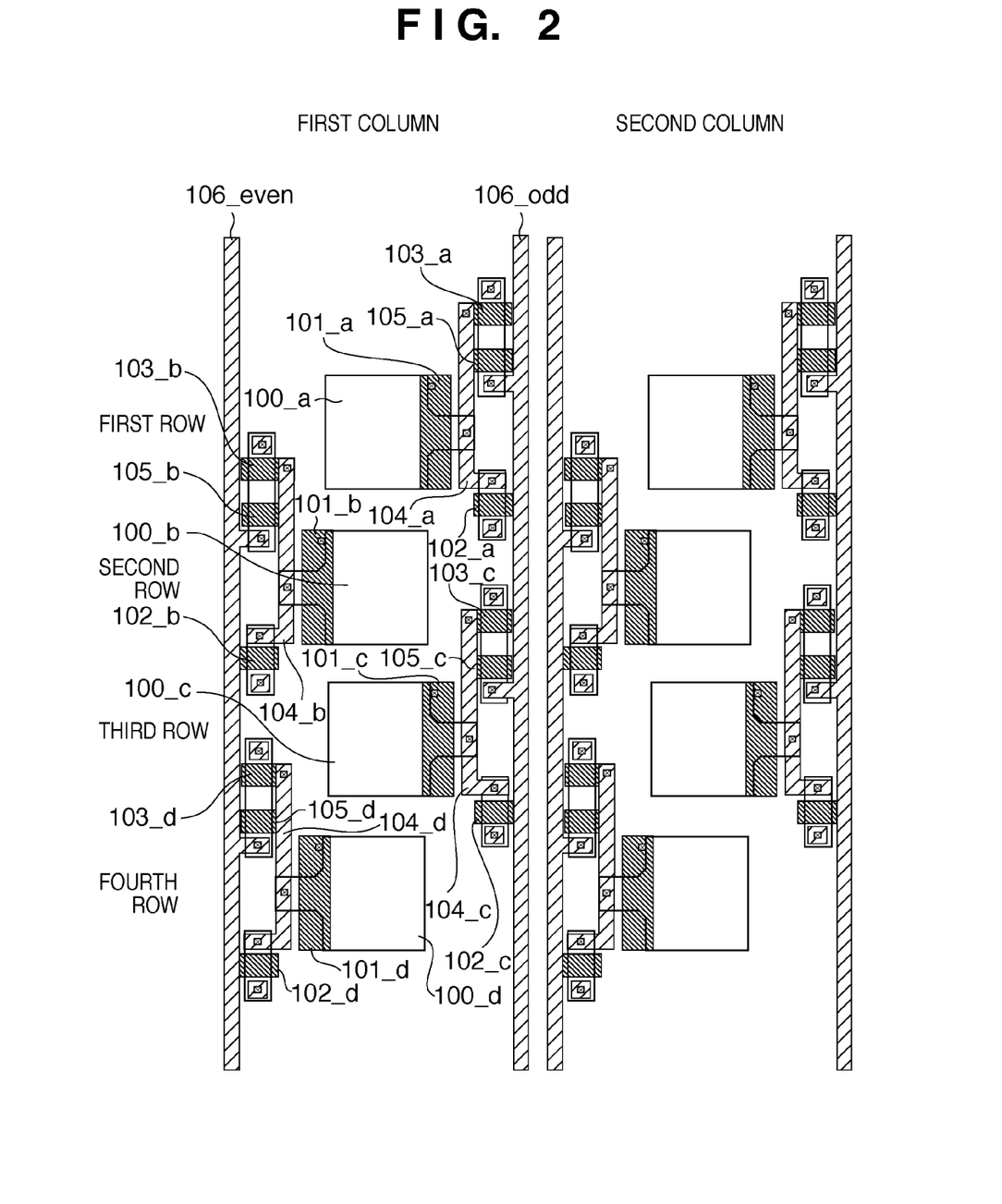
FIG. 2 is a plan layout diagram showing two pixel arrays in the first embodiment of the present invention.

FIG. 2 is a plan layout diagram showing two pixel columns in a pixel array, in which each pixel column has the circuitry shown in FIG. 1, according to the first embodiment of the present invention. FIG. 2 shows a pixel array including two pixels in the horizontal direction and four pixels in the vertical direction (two pixel columns×four pixel rows). Although an actual pixel array typically includes larger numbers of pixel columns and pixel rows, FIG. 2 shows only the first and second columns for the sake of descriptive simplicity. Also, FIG. 2 shows only pixels in the first to fourth rows among a plurality of pixels belonging to the first and second columns. Referring to FIG. 2, pixels in each column on odd rows (suffixes a and c) are connected to the column readout line 106_odd, and those in each column on even rows (suffixes b and d) are connected to the column readout line 106_even.

Referring to FIG. 2, reference numerals 100_a, 100_b, 100_c, and 100_d denote photodiodes. Reference numerals 101_a, 101_b, 101_c, and 101_d denote transfer transistors (to be more precise, the gate electrodes of the transfer transistors). Reference numerals 102_a, 102_b, 102_c, and 102_d denote reset transistors (to be more precise, the gate electrodes of the reset transistors). Reference numerals 103_a, 103_b, 103_c, and 103_d denote amplification transistors (to be more precise, the gate electrodes of the amplification transistors). Reference numerals 104_a, 104_b, 104_c, and 104_d denote FDs. Reference numerals 105_a, 105_b, 105_c, and 105_d denote row selection transistors (to be more precise, the gate electrodes of the row selection transistors).

In the first embodiment, the shortest distance between an FD (conversion region) (e.g., the FD 104_b) of a pixel belonging to a pixel row of the first group and a first column readout line (e.g., the column readout line 106_even) to which a signal from the pixel is output is less than or equal to that between the FD of the pixel and a second column readout line (e.g., the column readout line 106_odd) to which signals from pixels belonging to the pixel rows of the second group are output. Also, the shortest distance between an FD (e.g., the FD 104_a) of a pixel belonging to a pixel row of the second group and a second column readout line (e.g., the column readout line 106_odd) to which a signal from the pixel is output is less than or equal to that between the FD of the pixel and a first column readout line (e.g., the column readout line 106_even) to which signals from pixels belonging to the pixel rows of the first group are output. The same arrangement feature as in this case applies to the second to fifth embodiments to be described hereinafter.

Such an arrangement can reduce a parasitic capacitance value generated upon capacitive coupling between an FD (conversion region) of a pixel belonging to a pixel row of the first group and a column readout line to which signals from pixels belonging to the pixel rows of the second group are output. Similarly, a parasitic capacitance value generated upon capacitive coupling between an FD (conversion region) of a pixel belonging to a pixel row of the second group and a column readout line to which signals from pixels belonging to the pixel rows of the first group are output. This makes it possible to reduce crosstalk between signals from pixels belonging to the pixel rows of the first group and those from pixels belonging to the pixel rows of the second group (e.g., between signals in even rows and those in odd rows), thereby suppressing the occurrence of color mixing.

In the first embodiment illustrated in FIG. 2, photodiodes (e.g., the photodiodes 100_a, 100_b, 100_c, and 100_d) of respective pixels in a pixel column are arranged between a first column readout line (e.g., the column readout line 106_even) and second column readout line (e.g., the column readout line 106_odd) provided to the pixel column. An FD (conversion region) (e.g., the FD 104_b) of a pixel belonging to a pixel row (e.g., an even row) of the first group is arranged between a photodiode (e.g., the photodiode 100_b) of the pixel and a first column readout line (e.g., the column readout line 106_even) to which a signal from the pixel is output. Also, an FD (e.g., the FD 104_c) of a pixel belonging to a pixel row (e.g., an odd row) of the second group is arranged between a photodiode (e.g., the photodiode 100_a) of the pixel and a second column readout line (e.g., the column readout line 106_odd) to which a signal from the pixel is output.

Since such an arrangement can bring the FD 104 and the column readout line 106 in close proximity to each other, a change in potential of the FD 104 upon transferring a charge from the transfer transistor 101 to the FD 104 is immediately transmitted to the column readout line 106 via the amplification transistor 103. Hence, capacitive coupling between an FD and a column readout line to which a signal from the FD is read has a very small influence on the column readout line. Also, capacitive coupling between an FD and a column readout line to which a signal from the FD is read suppresses any capacitive coupling between the FD and other circuit components. Thus, the charge-voltage conversion gain improves, and the S/N ratio of the solid-state image sensor, in turn, improves.

Figure 3:
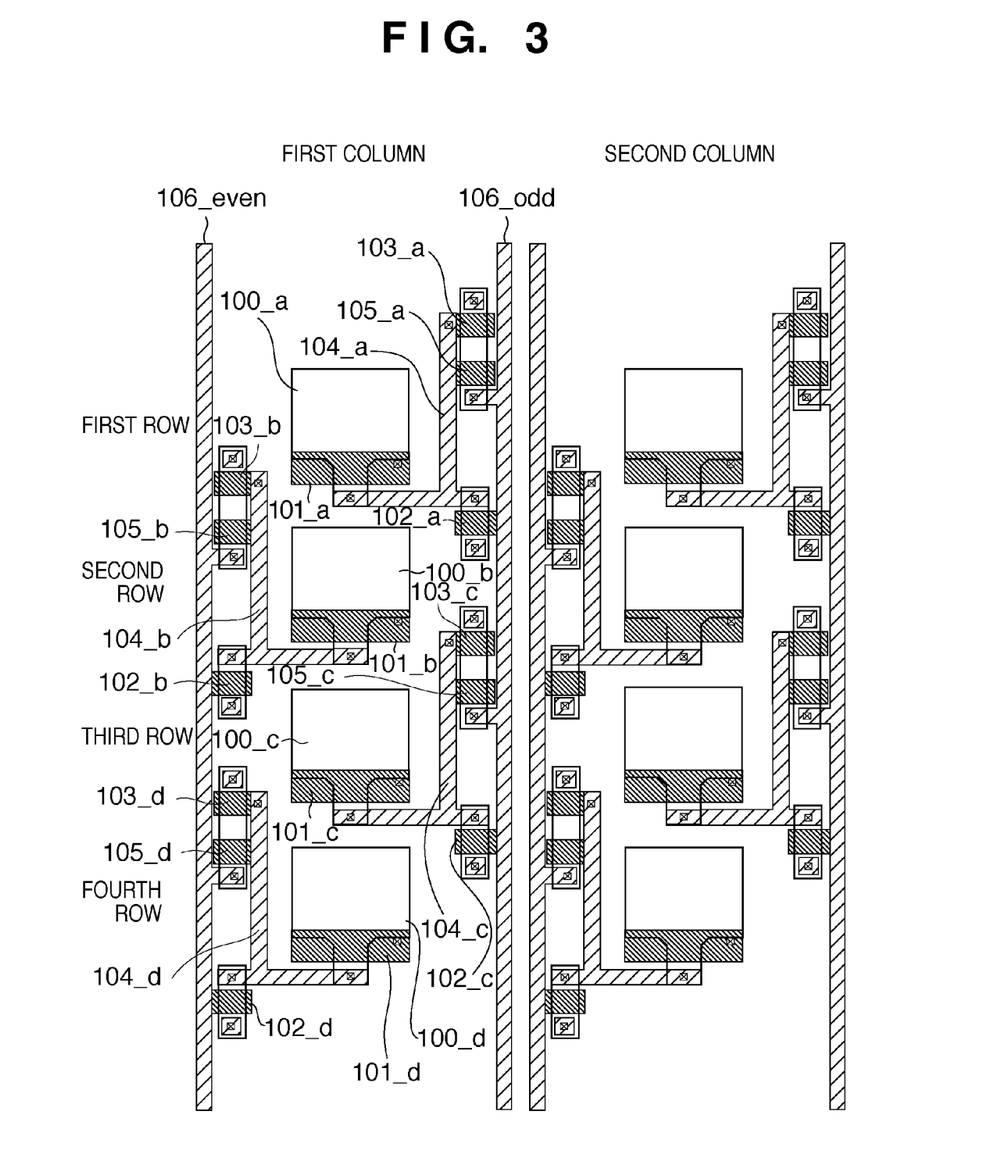
FIG. 3 is a plan layout diagram showing two pixel arrays in the second embodiment of the present invention.

FIG. 3 is a plan layout diagram showing two pixel columns in a pixel array, in which each pixel column has the circuitry shown in FIG. 1, according to the second embodiment. Although layout design of each constituent element shown in FIG. 3 is different from that in the first embodiment shown in FIG. 2, the second embodiment is the same as the first embodiment in terms of circuit diagrams.

In the second embodiment illustrated in FIG. 3, photodiodes (e.g., photodiodes 100_a, 100_b, 100_c, and 100_d) of respective pixels in a pixel column are arranged between a first column readout line (e.g., a column readout line 106_even) and second column readout line (e.g., a column readout line 106_odd) provided to the pixel column. Also, a transfer switch (e.g., a transfer transistor 101_a) of a pixel belonging to a pixel row of a first group is arranged in a first direction (the downward direction in FIG. 3) when viewed from the center of a photodiode (e.g., the photodiode 100_a) of the pixel. Also, a transfer switch (e.g., a transfer transistor 101_b) of a pixel belonging to a pixel row of a second group is arranged in the first direction when viewed from the center of a photodiode (e.g., the photodiode 100_b) of the pixel.

Moreover, in the second embodiment illustrated in FIG. 3, transfer transistors 101 of all pixels have the same shape.

In the second embodiment, because photodiodes of pixels in even rows have the same shape as those of pixels in odd rows, the difference in photoelectric conversion characteristic is very small between even rows and odd rows. Also, uniform photoelectric conversion characteristics are more likely to be obtained with a high yield despite the use of a simpler manufacturing method in the second embodiment than when photodiodes in even rows and those in odd rows have different shapes.

Figure 4:
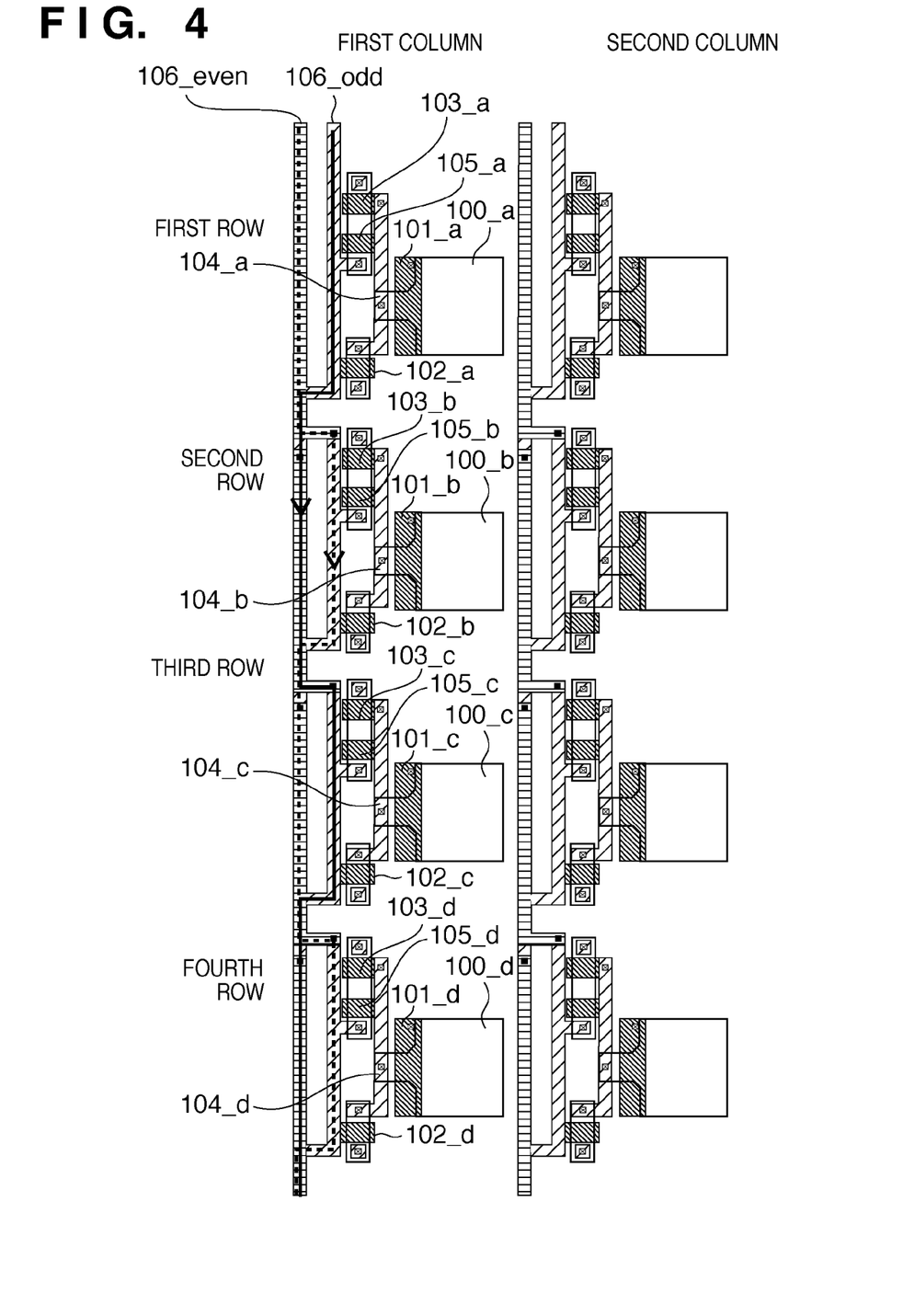
FIG. 4 is a plan layout diagram showing two pixel arrays in the third embodiment of the present invention.

FIG. 4 is a plan layout diagram showing two pixel columns in a pixel array, in which each pixel column has the circuitry shown in FIG. 1, according to the third embodiment. Although layout design of each constituent element shown in FIG. 4 is different from that in the first embodiment shown in FIG. 2, the third embodiment is the same as the first embodiment in terms of circuit diagrams.

In the third embodiment illustrated in FIG. 4, a first column readout line (e.g., a column readout line 106_even) to which a signal from a pixel belonging to a pixel row (e.g., an even row) of a first group is arranged in a second direction (the leftward direction in FIG. 4) when viewed from a photodiode (e.g., a photodiode 100_b) of the pixel. Also, a second column readout line (e.g., a column readout line 106_odd) to which a signal from a pixel belonging to a pixel row of a second group is arranged in the second direction when viewed from a photodiode (e.g., a photodiode 100_a) of the pixel. Note that referring to FIG. 4, the route of the first column readout line (e.g., the column readout line 106_even) is indicated by a dotted line, and that of the second column readout line (e.g., the column readout line 106_odd) is indicated by a solid line. Such a layout can be realized as the first column readout line and the second column readout line form a twisted structure, as illustrated in FIG. 4.

In the third embodiment, because pixels in even rows have the same shape as those in odd rows, the difference in characteristic is very small between even rows and odd rows. Also, uniform characteristics are more likely to be obtained with a high yield despite the use of a simpler manufacturing method in the third embodiment than when pixels in even rows and those in odd rows have different shapes.

Figure 5:
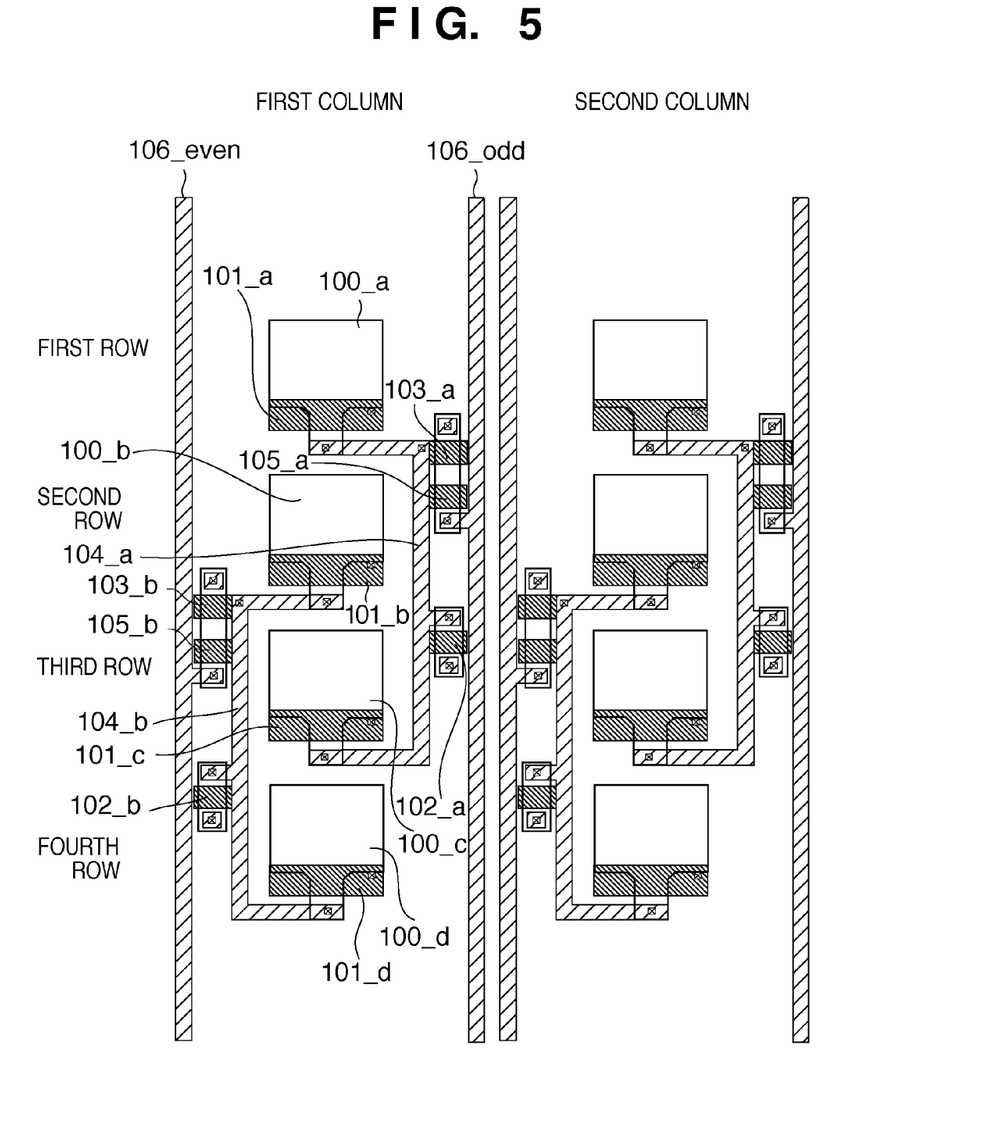
FIG. 5 is a plan layout diagram showing two pixel arrays in the fourth embodiment of the present invention.

FIG. 5 is a plan layout diagram showing the fourth embodiment of the present invention. The fourth embodiment is a modification to the second embodiment illustrated in FIG. 3. In the fourth embodiment as well, a plurality of pixel rows which form a pixel array PA are divided into pixel rows of a first group and those of a second group. However, the fourth embodiment is different from the first to third embodiments in that in the former the first group is divided into a plurality of subgroups, and the second group is divided into a plurality of subgroups.

Also, in the fourth embodiment, an FD (conversion region), an amplification element, and a reset element are shared by a plurality of pixels belonging to the same column and the same subgroup. Note that each subgroup is formed from pixels which share an FD and an amplification transistor (and a reset transistor, if any). In the embodiment illustrated in FIG. 5, for example, a pixel including a photodiode 100_a (the pixel in the first row on the first column), and that including a photodiode 100_c (the pixel in the third row on the first column) share an FD 104_a. Each pixel includes a photodiode and transfer transistor as unique constituent elements (i.e., as constituent elements that are not shared with other pixels). For example, the pixel in the first row on the first column includes the photodiode 100_a and a transfer transistor 101_a. The number of pixels which form each subgroup is not limited to 2, and can be an arbitrary number (generally, a power of 2) such as 4 or 8.

Signals from pixels belonging to pixel rows (e.g., even rows) of a first group are output to a first column readout line (e.g., a column readout line 106_even), and those from pixels belonging to pixel rows (e.g., odd rows) of a second group are output to a second column readout line (e.g., a column readout line 106_odd). The shortest distance between an FD (conversion region) (e.g., an FD 104_b) of a subgroup in the first group and a first column readout line (e.g., the column readout line 106_even) to which signals from pixels of the subgroup are output is less than or equal to that between the FD (e.g., the FD 104_b) of the subgroup and a second column readout line (e.g., the column readout line 106_odd) to which signals from the second group are output. Also, the shortest distance between an FD (e.g., the FD 104_a) of a subgroup in the second group and a second column readout line (e.g., the column readout line 106_odd) to which signals from pixels of the subgroup are output is less than or equal to that between the FD (e.g., the FD 104_a) of the subgroup and a first column readout line (e.g., the column readout line 106_even) to which signals from the first group are output.

By sharing an FD (conversion region) among a plurality of pixels as in the fourth embodiment, the number of pixels can be increased if a solid-state image sensor with the same size is used, and the areas of photodiodes (photoelectric conversion elements) can be increased if a solid-state image sensor with the same number of pixels is used.

In each of the first to fourth embodiments, a primary color filter including filters of three colors R, G, and B can be provided in the region of the pixel array PA. Alternatively, a complementary color filter including filters of four colors Ye, Cy, G, and Mg can be provided in the region of the pixel array PA.

Figure 7:
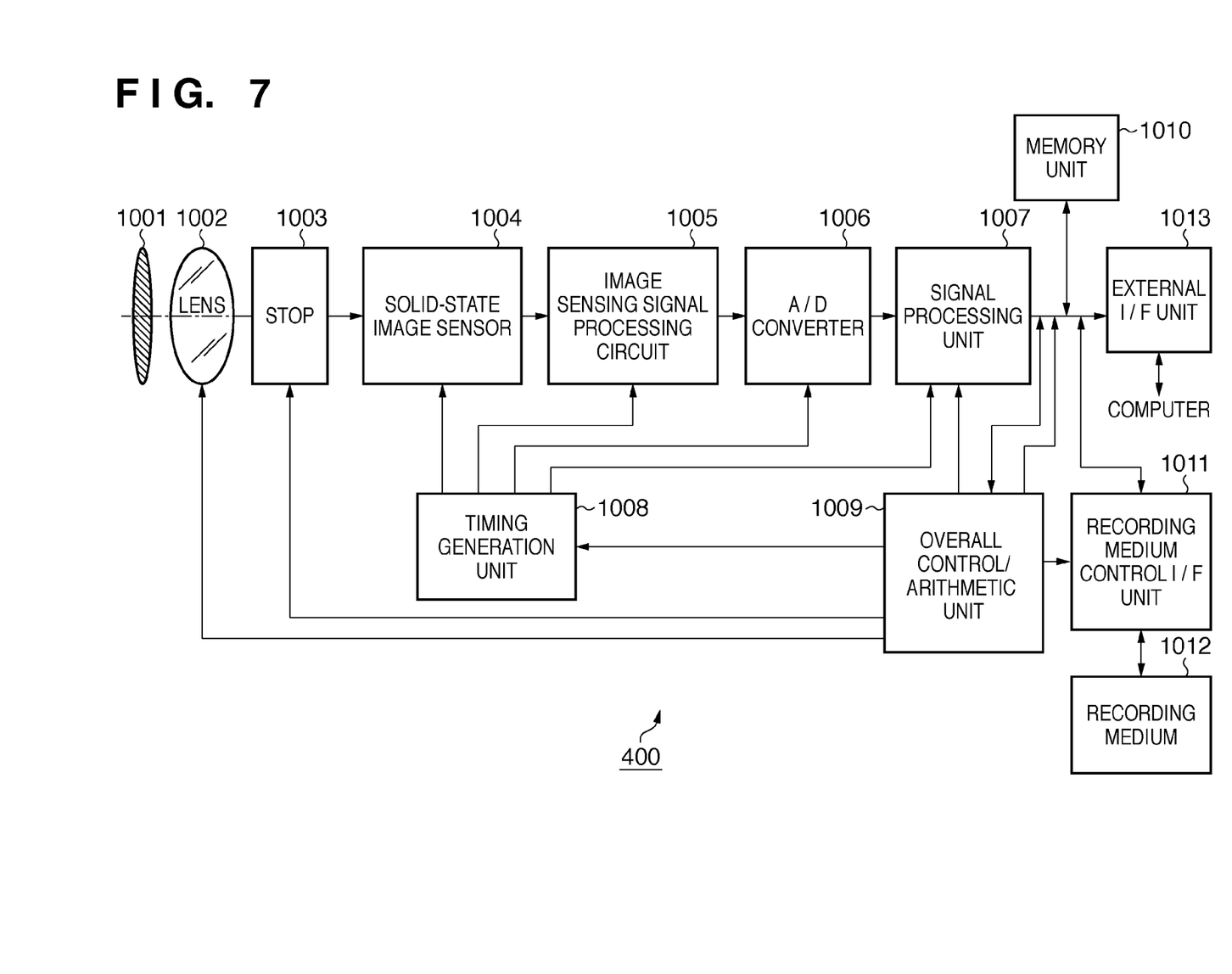
FIG. 7 is a block diagram showing the schematic configuration of an image sensing apparatus (camera) according to an embodiment of the present invention.

FIG. 7 is a block diagram showing the schematic configuration of an image sensing apparatus (camera) according to an embodiment of the present invention. An image sensing apparatus 400 includes a solid-state image sensor 1004 typified by the solid-state image sensor IS according to each of the first to fourth embodiments. An optical image of an object is formed on the image sensing surface of the solid-state image sensor 1004 by a lens 1002. A barrier 1001 which serves both as a protector of the lens 1002 and a main switch can be provided outside the lens 1002. A stop 1003 for adjusting the amount of light emerging from the lens 1002 can be provided to the lens 1002. Image sensing signals output via a plurality of channels from the solid-state image sensor 1004 undergo processes such as various types of correction and clamping by an image sensing signal processing circuit 1005. The image sensing signals output via the plurality of channels from the image sensing signal processing circuit 1005 are analog-to-digital-converted by an A/D converter 1006. The image data output from the A/D converter 1006 undergoes, for example, various types of correction and data compression by a signal processing unit 1007. The solid-state image sensor 1004, image sensing signal processing circuit 1005, A/D converter 1006, and signal processing unit 1007 operate in accordance with timing signals generated by a timing generation unit 1008.

The blocks 1005 to 1008 may be formed on a chip on which the solid-state image sensor 1004 is formed. Each block of the image sensing apparatus 400 is controlled by an overall control/arithmetic unit 1009. The image sensing apparatus 400 also includes a memory unit 1010 for temporarily storing image data, and a recording medium control interface unit 1011 for recording or reading out an image on or to a recording medium. A recording medium 1012 includes, for example, a semiconductor memory and is detachable. The image sensing apparatus 400 may include an external interface (I/F) unit 1013 for communication with, for example, an external computer.

The operation of the image sensing apparatus (camera) 400 shown in FIG. 7 will be described next. In response to opening of the barrier 1001, a main power supply, a power supply for a control system, and a power supply for image sensing system circuits such as the A/D converter 1006 are sequentially turned on. After that, to control the exposure value, the overall control/arithmetic unit 1009 opens the stop 1003. A signal output from the solid-state image sensor 1004 is provided to the A/D converter 1006 through the image sensing signal processing circuit 1005. The A/D converter 1006 A/D-converts the signal, and outputs the converted data to the signal processing unit 1007. The signal processing unit 1007 processes the data and provides the processed data to the overall control/arithmetic unit 1009. The overall control/arithmetic unit 1009 performs an arithmetic operation for determining the exposure value. The overall control/arithmetic unit 1009 controls the stop 1003 based on the determined exposure value.

The overall control/arithmetic unit 1009 extracts high-frequency components from the signal which is output from the solid-state image sensor 1004 typified in the above-described first to fourth embodiments and is processed by the signal processing unit 1007, and calculates the distance to the object based on the high-frequency components. After that, the lens 1002 is driven to determine whether an in-focus state is obtained. If it is determined that an in-focus state is not obtained, the lens 1002 is driven and the distance is calculated again.

After an in-focus state is confirmed, final exposure starts. After the exposure is completed, the image sensing signal output from the solid-state image sensor 1004 undergoes, for example, correction by the image sensing signal processing circuit 1005, is A/D-converted by the A/D converter 1006, and is processed by the signal processing unit 1007. The image data processed by the signal processing unit 1007 is stored in the memory unit 1010 by the overall control/arithmetic unit 1009.

After that, the image data stored in the memory unit 1010 is recorded on the recording medium 1012 via the recording medium control I/F unit 1011 under the control of the overall control/arithmetic unit 1009. Also, the image data can be provided to, for example, a computer via the external I/F unit 1013, and processed by it.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-232867, filed Oct. 6, 2009, which is hereby incorporated by reference herein in its entirety.

What is claimed is:
1. A CMOS image sensor comprising:
a pixel array in which a plurality of pixels are two-dimensionally arranged so as to form a plurality of pixel rows and a plurality of pixel columns; and
a first column readout line and a second column readout line provided to each pixel column, wherein:
the plurality of pixel rows that form the pixel array are divided into pixel rows of a first group and pixel rows of a second group,
each pixel includes a photoelectric conversion element, a conversion region that includes a floating diffusion and converts a charge generated in the photoelectric conversion element into a voltage, a transfer element that transfers the charge generated in the photoelectric conversion element to the conversion region, a reset transistor that resets a voltage of the photoelectric conversion element, and an amplification element that outputs a signal in accordance with the voltage converted in the conversion region, pixels belonging to the pixel rows of the first group output signals to the first column readout line, and pixels belonging to the pixel rows of the second group output signals to the second column readout line, a shortest distance between the floating diffusion of the conversion region of a first pixel belonging to a pixel row of the first group and the first column readout line to which a signal from the first pixel is output is not more than a shortest distance between the floating diffusion of the conversion region of the first pixel and the second column readout line to which the signals from the pixels belonging to the pixel rows of the second group are output, a shortest distance between the floating diffusion of the conversion region of a second pixel belonging to a pixel row of the second group and the second column readout line to which a signal from the second pixel is output is not more than a shortest distance between the floating diffusion of the conversion region of the second pixel and the first column readout line to which the signals from the pixels belonging to the pixel rows of the first group are output, the amplification element of the first pixel is physically arranged between the first column readout line to which the signal from the first pixel is output and the photoelectric conversion element of the first pixel, the amplification element of the second pixel is physically arranged between the second column readout line to which the signal from the second pixel is output and the photoelectric conversion element of the second pixel, a source, a drain, and a gate of the reset transistor of the first pixel are physically arranged, when the sensor is viewed from above, between the first column readout line to which the signal from the first pixel is output and the photoelectric conversion element of the first pixel, and a source, a drain, and a gate of the reset transistor of the second pixel are physically arranged, when the sensor is viewed from above, between the second column readout line to which the signal from the second pixel is output and the photoelectric conversion element of the second pixel.

2. The sensor according to claim 1, wherein
the photoelectric conversion element of each pixel in a pixel column is physically arranged between the first column readout line and the second column readout line provided to the pixel column,
the conversion region of the first pixel belonging to the pixel row of the first group is physically arranged between the photoelectric conversion element of the first pixel and the first column readout line to which a signal from the first pixel is output, and
the conversion region of the second pixel belonging to the pixel row of the second group is physically arranged between the photoelectric conversion element of the second pixel and the second column readout line to which a signal from the second pixel is output.

3. The sensor according to claim 1, wherein
the photoelectric conversion element of each pixel in a pixel column is physically arranged between the first column readout line and the second column readout line provided to the pixel column,
the transfer element of the first pixel belonging to the pixel row of the first group is arranged in a first direction when viewed from the center of the photoelectric conversion element of the first pixel, and
the transfer element of the second pixel belonging to the pixel row of the second group is arranged in the first direction when viewed from the center of the photoelectric element of the second pixel.

4. The sensor according to claim 1, wherein
the first column readout line to which a signal from the first pixel belonging to the pixel row of the first group is output is arranged in a second direction when viewed from the photoelectric conversion element of the first pixel,
the second column readout line to which a signal from the second pixel belonging to a pixel row of the second group is output is arranged in the second direction when viewed from the photoelectric conversion element of the second pixel, and
the first column readout line and the second column readout line form a twisted structure.

5. The sensor according to claim 1, wherein the pixel rows of the first group are odd-numbered pixel rows, and the pixel rows of the second group are even-numbered pixel TOWS.

6. The sensor according to claim 1, wherein a primary color filter including filters of three colors R, G, and B is provided in a region of the pixel array.

7. The sensor according to claim 1, wherein a complementary color filter including filters of four colors Ye, Cy, G, and Mg is provided in a region of the pixel array.

8. The sensor according to claim 1, wherein the sensor is incorporated into an image sensing apparatus that includes a signal processing unit configured to process a signal obtained by the sensor.

9. The sensor according to claim 1, wherein the first column readout line and the second column readout line are electrically conductive lines.

10. The sensor according to claim 1, wherein centers of the photoelectric conversion elements of the pixels belonging to the pixel rows of the first group and centers of the photoelectric conversion elements of the pixels belonging to the pixel rows of the second group are arranged in a straight line.

11. The sensor according to claim 1,
wherein each transfer element includes a gate electrode that forms a transfer transistor,
wherein the source, the drain, and the gate of the reset transistor of the first pixel are physically arranged, when the sensor is viewed from above, between the first column readout line to which the signal from the first pixel is output and the gate electrode of the transfer element of the first pixel, and
wherein the source, the drain, and the gate of the reset transistor of the second pixel are physically arranged, when the sensor is viewed from above, between the second column readout line to which the signal from the second pixel is output and the gate electrode of the transfer element of the second pixel.

* * * * *